United States Patent
Ackmann et al.

(10) Patent No.: US 6,271,602 B1
(45) Date of Patent: Aug. 7, 2001

(54) METHOD FOR REDUCING THE SUSCEPTIBILITY TO CHEMICAL-MECHANICAL POLISHING DAMAGE OF AN ALIGNMENT MARK FORMED IN A SEMICONDUCTOR SUBSTRATE

(75) Inventors: Paul W. Ackmann, Buda; Richard D. Edwards; Stuart E. Brown, both of Austin, all of TX (US); Khanh B. Nguyen, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/386,861

(22) Filed: Aug. 31, 1999

(51) Int. Cl.$^7$ .................................................. H01L 23/544
(52) U.S. Cl. ........................ 257/797; 257/622; 438/401
(58) Field of Search ................................ 257/797, 622; 438/700, 401

(56) References Cited

U.S. PATENT DOCUMENTS

| | | | |
|---|---|---|---|
| 4,893,163 | * | 1/1990 | Rudeck . |
| 5,594,258 | * | 1/1997 | Huber et al. . |
| 5,684,333 | * | 11/1997 | Moriyama . |
| 6,015,744 | * | 6/2000 | Tseng . |
| 6,049,137 | * | 4/2000 | Jang et al. . |
| 6,081,040 | * | 6/2000 | Okada et al. . |

* cited by examiner

*Primary Examiner*—Sheila V. Clark
(74) *Attorney, Agent, or Firm*—Kevin L. Daffer; Conley, Rose & Tayon P.C.

(57) ABSTRACT

A method for processing a semiconductor substrate is presented wherein an alignment mark is formed in an alignment mark area of the semiconductor substrate. The alignment mark area is contained within a window area of the semiconductor substrate. The upper surface of the semiconductor substrate within the window area is recessed below the upper surface of the semiconductor substrate outside of the window area, preferably by exposing the upper surface of the semiconductor substrate within the window area to an etchant. Such recession forms an alignment mark trench within the window area. Being substantially recessed below the original surface of the semiconductor substrate, an alignment mark formed in such a manner may be substantially protected from chemical-mechanical polishing damage during subsequent processing steps.

23 Claims, 12 Drawing Sheets

METHOD FOR REDUCING THE SUSCEPTIBILITY TO CHEMICAL-MECHANICAL POLISHING DAMAGE OF AN ALIGNMENT MARK FORMED IN A SEMICONDUCTOR SUBSTRATE

BACKGROUND OF THE INVENTION

1. Field of the Invention

This invention relates to semiconductor processing and, more particularly, to a method for preventing damage to an alignment mark from chemical-mechanical polishing and to an alignment mark having a substantially reduced chance of being damaged by such polishing.

2. Description of the Related Art

Semiconductor processing, and particularly integrated circuit fabrication, involves the formation of numerous structures or features upon a semiconductor topography. The base of the semiconductor topography is typically a wafer of single crystal silicon. The features are placed in localized areas of the semiconductor topography and are conductive, non-conductive, or semi-conductive (i.e. rendered conductive in defined areas with dopants). As the features are usually only a few microns or less in size, their precise placement upon the semiconductor topography can have a large effect upon the functionality of the finished product. The surface dimensions of the features may be defined by a process known as photolithography ("lithography").

In lithography, radiation is used to pattern a photosensitive film (i.e. resist) deposited upon the semiconductor topography. Patterning of the resist generally involves first selectively exposing the resist to radiation through an exposure mask. Ultraviolet light is the primary form of radiation used to pattern resists, but x-rays and electron beams are growing in popularity. The exposure mask may be either a full mask carrying the entire pattern to be transferred to the wafer or a reticle carrying only a portion of the entire pattern. Because of the difficulty of making a mask capable of projecting a quality image over an entire wafer at once, reticles are more common than full masks. Reticles are used to step-and-repeat an image across a wafer, and exposure tools that operate in such a fashion are called steppers.

The passage of radiation through the exposure mask is partially inhibited by a patterned coating formed on the mask. The patterned coating is often made of chrome. The shape of the patterned coating corresponds to the desired pattern to be transferred to the resist. Because the patterned coating blocks the passage of radiation where the coating is present, the use of an exposure mask having such a coating allows a particular pattern within the resist to be selectively exposed to radiation.

Two properties of resists make them extremely useful in lithographic processes. First, the solubility of resists in particular chemical solvents (developers) may be altered by exposure to appropriate radiation. Second, a resist layer may be hardened to become resistant to attack by an etchant capable of selectively removing exposed layers underneath. Resists are classified as either negative or positive based upon their reaction to radiation exposure. Negative resists are relatively soluble as deposited, but become insoluble upon exposure to radiation. Positive resists are relatively insoluble as deposited, but solubilize upon exposure to radiation. Regardless of the type of radiation used, after selective exposure to radiation as described above some portions of the resist layer are insoluble and other portions are soluble. The resist layer is then washed with a developer configured to remove the relatively soluble portions of the resist while leaving as much as possible of the relatively insoluble portions of the resist. Removal of the insoluble portions transfers the exposure mask pattern to the resist. With the resist patterned, an etchant may be used to remove underlying portions of the semiconductor topography unprotected (i.e., not covered) by the resist. The resist is then removed, making the transfer of the exposure mask pattern complete.

During photolithography, the exposure mask pattern must be properly positioned relative to previously formed patterns upon the semiconductor topography. One measure of how closely different levels of a pattern are aligned is termed registration. Proper registration, or alignment, is essential if a functioning circuit is desired. Alignment of the exposure mask pattern to previously formed layers is often accomplished using a structure called an alignment mark. An alignment mark typically contains a plurality of patterns formed within an alignment mark area of the wafer and having a particular spatial relationship. Alignment marks are usually formed in the edge area of the wafer or near the scribe lines separating die on the wafer.

Modern steppers almost universally use automatic alignment systems to align the reticle to the wafer. The reticle typically contains alignment marks that correspond or are complementary in shape to the alignment marks formed on the wafer, but are of dissimilar size. In a conventional alignment system, low energy laser beams are passed through the alignment marks on the reticle and reflected off the corresponding alignment marks on the wafer. The reflected signal is analyzed, and the chuck on which the wafer is placed is repositioned. The process may be continued until the marks are aligned.

FIG. 1 presents a cross-sectional view of silicon wafer 100 having a conventional alignment mark formed therein. The alignment mark includes grooves 102 formed in alignment mark area 104 of wafer 100. A stepper attempting to align to the mark shown in FIG. 1 can analyze radiation reflected off wafer 100 to determine the relative position along points of the wafer surface. A typical grating alignment system used by steppers reads the elevation drop and rise that occurs as the laser scans from the original upper surface of wafer 100 next to grooves 102 to the recessed upper surface of wafer 100 within grooves 102 and then back up to the original upper surface of wafer 100. These readings may then be compared to predicted results to determine the position of the reticle relative to the wafer. The accuracy of the alignment process is often highly dependent on the alignment mark having sharply defined transitions from the surface of wafer 100 to the bottom of grooves 102. The surface of wafer 100 should preferably be kept uniformly flat and the walls of groove 102 should preferably be substantially vertical to allow the alignment system to receive the clearest signal.

Unfortunately, subsequent integrated circuit processing steps can result in damage to the wafer surface within the alignment mark area and destruction of the sharp transitions that may be essential for optimal alignment. As shown in FIG. 2, subsequent processing steps necessary for the fabrication of features upon wafer 100 may result in the deposition of layers such as silicon dioxide ("oxide") layer 106, silicon nitride ("nitride") layer 108, and CMP oxide layer 110 upon wafer 100. These layers are then typically planarized to the surface of wafer 100 using chemical-mechanical polishing ("CMP"). The upper surface of the semiconductor substrate next to and within alignment mark area 104 is often directly polished during this step. Any remaining portions of the above-described oxide and nitride layers are usually removed in further processing. Oxide fill material 1 12 may then be deposited over wafer 100, filling grooves 102. The oxide fill material is then polished such that it is substantially contained within grooves 102 and such that its upper surfaces are relatively coplanar with the upper surface of wafer 100 (see FIG. 3). Because of the desire for a high degree of planarization, the upper surface of wafer 100 may again be exposed to direct polishing for a substantial period. As can be seen in this example, conventional semiconductor fabrication processes often result in the polishing of the surface of wafer 100 in and near alignment mark area 104 for a substantial period of time.

Direct polishing of the surface of wafer 100 in alignment mark area 104 can do a great deal of damage to the silicon surface of wafer 100, mostly due to the conformability of the CMP pad and/or mechanical or chemical abrasiveness of the CMP slurry. As shown in FIG. 3, polishing can result in distortion of the surface of wafer 100 in and near alignment mark area 104. Distortion of the wafer upper surface can result in the wafer surface being elevationally displaced from desired levels. For example, the CMP pad may bend into materials such as oxide fill material 112 during the polishing process. Such uneven pad application can result in an upper corner of groove 102 being polished down, destroying the sharp transition between the wafer upper surface outside the groove and the wafer upper surface within the groove that preferably exists.

Polish-induced damage to the alignment mark can be exacerbated by the location of an alignment mark. As stated above, a common location for these marks is near the edge of the wafer. The edge of the wafer is often considered a "no-care" zone of the wafer because of the presence of partial die. Accordingly, device density is often lower near the wafer edge, which may cause different loading effects than in other areas of the wafer. These differences often contribute to making the CMP-induced damage to the wafer surface in and near alignment mark area 104 quite severe.

CMP-induced damage to the alignment mark can cause problems when attempting to properly align an exposure tool relative to the wafer. For example, if the height along the surface of wafer 100 in and near the alignment mark area is significantly distorted from normal, the mark will not reflect light properly and the stepper can receive weak or false signals. Because of such poor signals, the marks in the exposure mask may be translated or rotated from a proper alignment with the marks in wafer 100. The poor feature registration that can result may render the final circuit inoperative.

Therefore, it would be desirable to develop a method for processing a semiconductor substrate that protects an alignment mark formed in the substrate from CMP-induced damage. The alignment mark produced by such a method would thus allow for a greater degree of accuracy and reduced variability when aligning an exposure tool to the substrate.

SUMMARY OF THE INVENTION

The problems described above are in large part addressed by the method for processing a semiconductor substrate presented herein. In the present method, an alignment mark is formed in an alignment mark area of the semiconductor substrate. The alignment mark area is preferably contained within a window area of the semiconductor substrate. In a processing step of the present method, the upper surface of the semiconductor substrate within the window area may be recessed below the upper surface of the semiconductor substrate outside of the window area. Such recession preferably forms an alignment mark trench within the window area. The alignment mark may be formed either prior to or subsequent to recessing the upper surface of the semiconductor substrate within the window area.

Regardless of the order in which the above-described steps are carried out, the result preferably is the formation of an alignment mark that is substantially recessed below the upper surface of the semiconductor substrate outside the window area. As such, the alignment mark will have a reduced likelihood of being subjected to CMP-induced damage during subsequent processing steps. An alignment mark protected from CMP-induced damage in such a manner preferably allows for improved exposure tool alignment when compared to conventionally formed alignment marks.

In an embodiment, at least one groove may first be patterned into an alignment mark area of the semiconductor substrate for forming an alignment mark. A masking layer may then be formed above the semiconductor substrate. A window may be patterned in the masking layer. The boundaries of the window substantially define a window area of the semiconductor substrate. The alignment mark area is preferably contained within the window area. The upper surface of the semiconductor substrate within the window area may then be exposed to an etchant for recessing the upper surface of the semiconductor substrate within the window area below the upper surface of the semiconductor substrate outside the window area. An alignment mark trench may thus be formed within the window area at an alignment mark trench depth from the upper surface of the semiconductor substrate outside of the window area.

One or more auxiliary layers may be formed above the semiconductor substrate in a processing step. These auxiliary layers are formed as part of the overall manufacturing process and are generally independent of alignment mark formation. Options for auxiliary layers include a nitride layer formed upon an oxide layer. Portions of the auxiliary layers that are above the window area are preferably removed prior to exposing the upper surface of the semiconductor substrate within the window area to an etchant.

The window area is preferably spaced from the alignment mark area by at least a first distance. The first distance may be between about 1 micron and 3 millimeters. It is often important to have a uniform substrate upper surface not only within the alignment mark area, but also in the portions of the semiconductor substrate immediately adjacent to the alignment mark area. If the portions of the semiconductor substrate immediately adjacent to the alignment mark area are damaged by CMP, an alignment system attempting to align to the alignment mark may receive poor signals from radiation reflected off the semiconductor substrate at the edges of the alignment mark area. Spacing the boundaries of the window area from the alignment mark area in such a manner preferably creates a buffer zone next to the recessed alignment mark area. The semiconductor substrate upper surface in the buffer zone may also be protected from CMP-induced damage by being recessed. Consequently, alignment problems at the edges of the alignment mark area may be substantially reduced over conventional methods.

Recessing of the upper surface of the semiconductor substrate within the window area is preferably carried out by exposing the upper surface of the semiconductor substrate within the window area an etchant. The etchant used is preferably capable of removing silicon at substantially the same rate across the window area. The use of such an etchant preferably allows all features formed in the substrate upper surface within the window area to be transferred downward by the depth of the etch. The depth to which the upper surface of the semiconductor substrate within the window area is recessed, or the alignment mark trench depth, should be sufficiently deep to prevent CMP-induced damage to the upper surface of the semiconductor substrate within the window area during further processing steps. Because of the recession process, the upper surface of the semiconductor substrate within the window area is preferably uniformly recessed an alignment mark trench depth below the upper surface of the semiconductor substrate outside of the window area.

Isolation trenches may be formed in field regions of the semiconductor substrate during the fabrication process. Such trenches preferably provide electrical isolation between adjacent active areas of the semiconductor substrate. The isolation trenches are commonly formed by etching a trench within an isolation trench area of the semiconductor substrate. The depth of the isolation trench (i.e., the isolation trench depth) is dependent on design requirements. Recessing the upper surface of the semiconductor substrate within the window area may be carried out concurrently with forming an isolation trench by simultaneously exposing the semiconductor substrate upper surface within the window area and within the isolation trench area to an etchant. Consequently, the isolation trench depth and the alignment mark trench depth may be substantially equal. Recessing the upper surface of the semiconductor substrate within the window area in such a manner is beneficial because an extra etch step beyond the isolation trench etch step is not needed.

In another embodiment, a masking layer is first formed above the semiconductor substrate. A window may be patterned in the masking layer. The boundaries of the window substantially define a window area of the semiconductor substrate. An alignment mark area is preferably contained within the window area. The upper surface of the semiconductor substrate within the window area may then be exposed to an etchant for recessing the upper surface of the semiconductor substrate within the window area below the upper surface of the semiconductor substrate outside the window area. An alignment mark trench may thus be formed within the window area at an alignment mark trench depth from the upper surface of the semiconductor substrate outside of the window area. At least one groove may then be patterned in the alignment mark area for the purpose of forming an alignment mark.

A semiconductor topography is also provided. The semiconductor topography preferably includes a semiconductor substrate. The upper surface of the semiconductor substrate within a window area of the semiconductor substrate is preferably disposed an alignment mark trench depth below the surface of the semiconductor substrate outside of the window area such that an alignment mark trench is defined within the window area. An alignment mark area of the semiconductor substrate is preferably contained within the window area. An alignment mark is preferably arranged within the alignment mark area.

BRIEF DESCRIPTION OF THE DRAWINGS

Other objects and advantages of the invention will become apparent upon reading the following detailed description and upon reference to the accompanying drawings in which:

FIG. 10a is a partial cross-sectional view of the semiconductor topography, wherein the upper surface of the semiconductor substrate within the window area is recessed below the upper surface of the semiconductor substrate outside the window area such that an alignment mark trench is formed within the window area according to a processing step subsequent to FIG. 9a;

FIG. 11 is a partial cross-sectional view of the semiconductor topography, wherein an alignment mark trench fill material is deposited according to a processing step subsequent to FIG. 10a;

FIG. 18a is a partial cross-sectional view of the semiconductor topography, wherein the upper surface of the semiconductor substrate within the window area is recessed below the upper surface of the semiconductor substrate outside the window area such that an alignment mark trench is formed within the window area according to a processing step subsequent to FIG. 17a;

FIG. 19 is a partial cross-sectional view of the semiconductor topography, wherein a second masking layer is formed according to a processing step subsequent to FIG. 18a;

Figure 1:
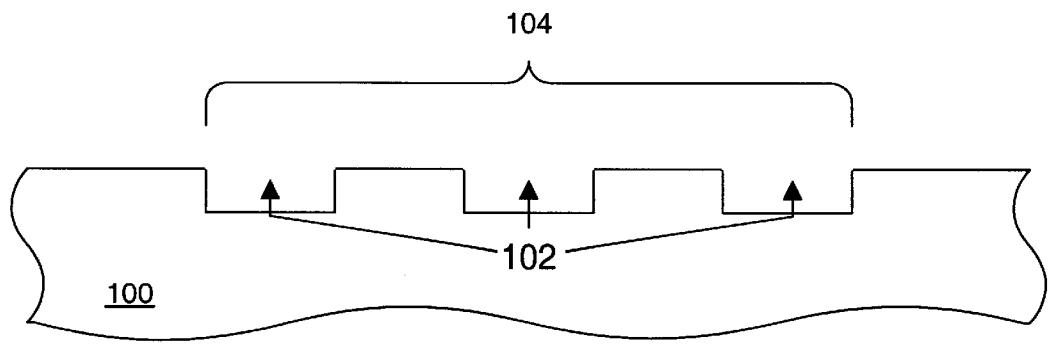
FIG. 1 is a partial cross-sectional view of a silicon wafer, wherein grooves are patterned in an alignment mark area of the wafer according to a step in a conventional integrated circuit fabrication process.
Figure 2:
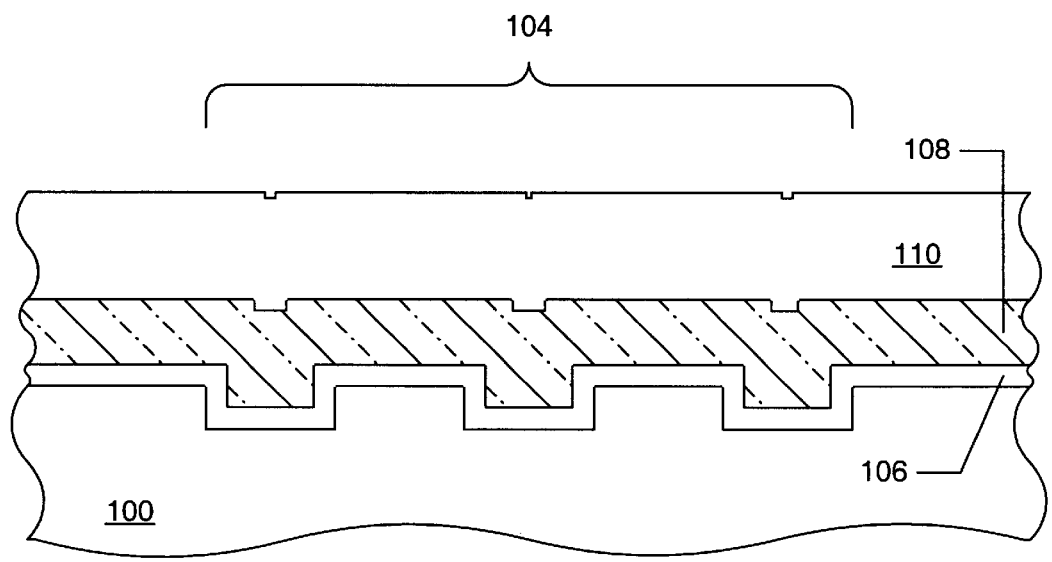
FIG. 2 is a partial cross-sectional view of the silicon wafer, wherein an oxide layer, a nitride layer, and a CMP oxide layer are deposited above the wafer according to a step in a conventional integrated circuit fabrication process subsequent to FIG. 1.
Figure 3:
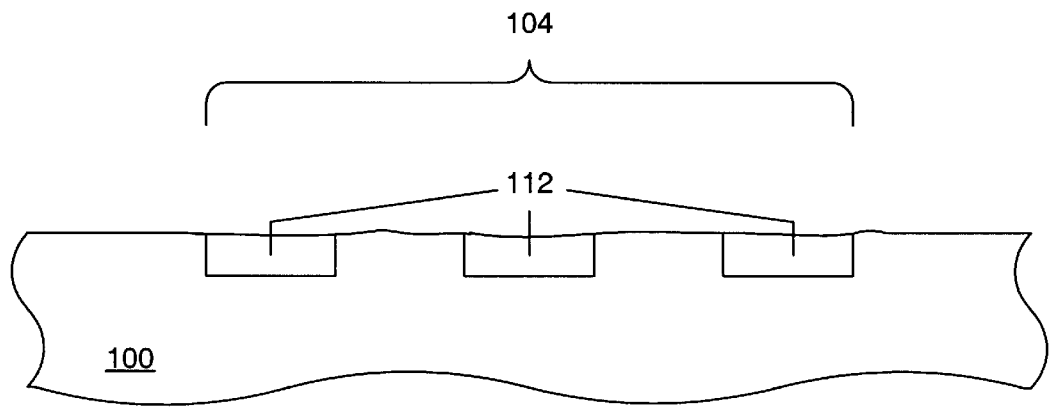
FIG. 3 is a partial cross-sectional view of the silicon wafer, wherein an oxide fill material is planarized such that it is substantially contained within the grooves and such that its upper surfaces are relatively coplanar with the upper surface of the wafer according to a step in a conventional integrated circuit fabrication process subsequent to FIG. 2.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 4:
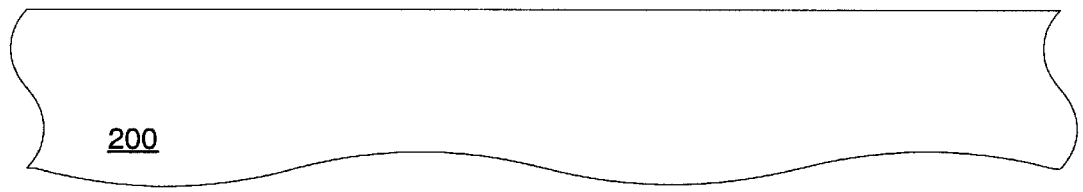
FIG. 4 is a partial cross-sectional view of a semiconductor topography in accordance with an embodiment of the present invention.

Referring now to the drawings, FIGS. 4–12 illustrate an embodiment of a process sequence for forming an alignment mark that is substantially recessed. FIG. 4 shows a partial cross-sectional view of semiconductor substrate 200. Semiconductor substrate 200 is preferably a lightly-doped wafer of single crystal silicon.

Figure 5:
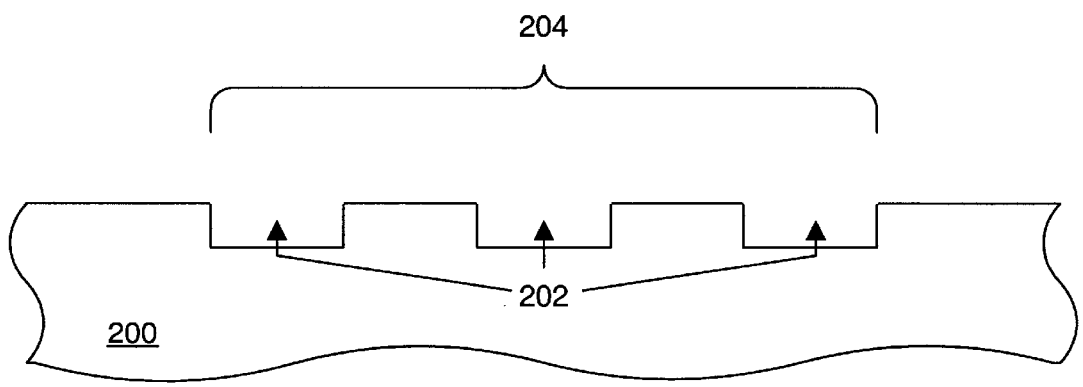
FIG. 5 is a partial cross-sectional view of the semiconductor topography, wherein grooves arc patterned in an alignment mark area of the semiconductor substrate according to a processing step subsequent to FIG. 4.

FIG. 5 depicts a processing step in which an alignment mark is formed in alignment mark area 204 of semiconductor substrate 200. As discussed herein, the term alignment mark includes any feature or group of features to which an alignment system of an exposure tool is capable of aligning for lithographic purposes. The present method is particularly useful in relation to alignment marks that could have their effectiveness reduced by CMP-induced damage. Although the alignment mark may be any of the wide variety known in the art, the alignment mark shown in FIG. 5 preferably contains a series of grooves 202 arranged within alignment mark 204. Alignment mark area 204 may contain more grooves than are shown in FIG. 5. Additionally, grooves 202 are not necessarily positioned in the particular spatial arrangement depicted but may instead be arranged in any number of alternate configurations.

Patterning of grooves 202 into the semiconductor substrate may be accomplished by spinning on a resist layer above semiconductor substrate 200 and then appropriately exposing and developing the resist layer. The portions of the semiconductor substrate not protected by the resist layer may then be exposed to an etchant for a time suitable to form the grooves. Grooves 202 are each at a depth which has been determined to give a maximum alignment signal output for all layers. There are numerous other depths that will also produce good alignment signals. The grooves may have a pitch (i.e., center-to-center spacing) of greater than about 5 microns. Steppers capable of aligning to such an alignment mark are available from, for example, ASM Lithography, Veldhoven, The Netherlands.

Figure 6:
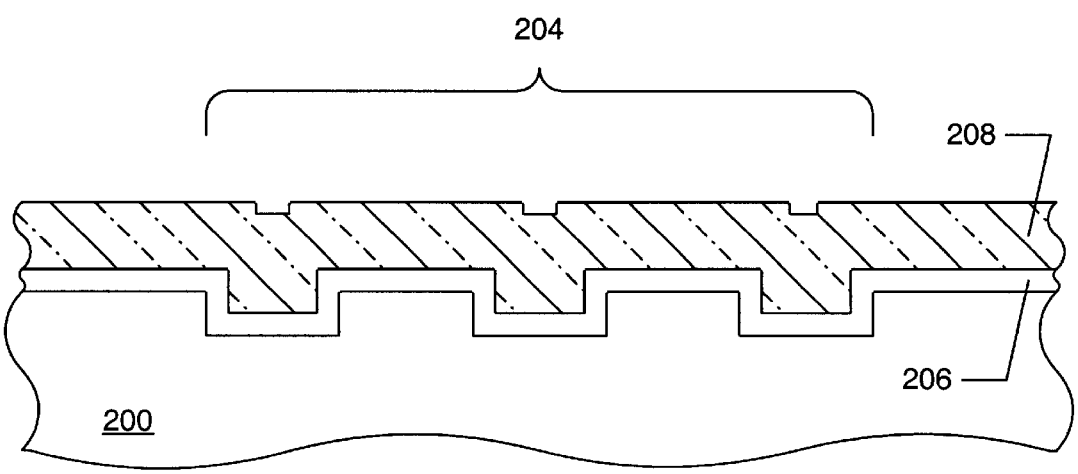
FIG. 6 is a partial cross-sectional view of the semiconductor topography, wherein an oxide layer and a nitride layer are deposited according to a processing step subsequent to FIG. 5.

FIG. 6 depicts a subsequent processing step in which oxide layer 206 and nitride layer 208 are formed above semiconductor substrate 200. These layers may be considered to be auxiliary layers in the sense of this disclosure; the layers may be formed as part of the overall manufacturing process but the particular compositions or number of the layers are not essential to the present method. Modifications may be made to the combination of layers deposited in this step as may be necessitated by the overall fabrication process and as would be apparent to one skilled in the art having the benefit of this disclosure.

Figure 7:
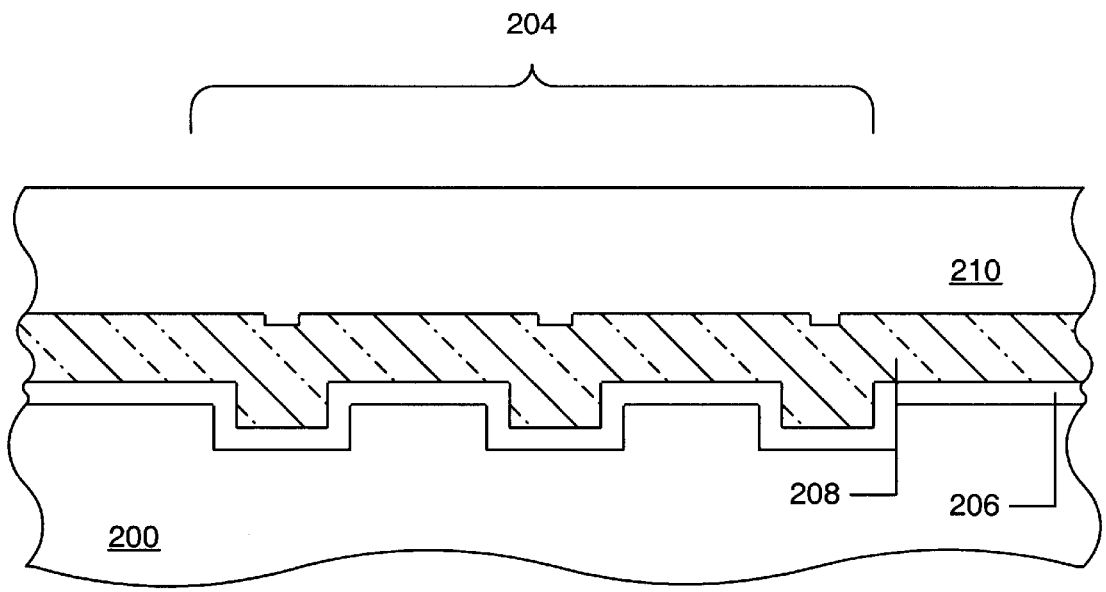
FIG. 7 is a partial cross-sectional view of the semiconductor topography, wherein a masking layer is formed above the semiconductor substrate according to a processing step subsequent to FIG. 6.

FIG. 7 presents a subsequent processing step in which masking layer 210 is formed above semiconductor substrate 200. Masking layer 210 is preferably composed of photoresist, and may be spun on as known in the art.

Figure 8:
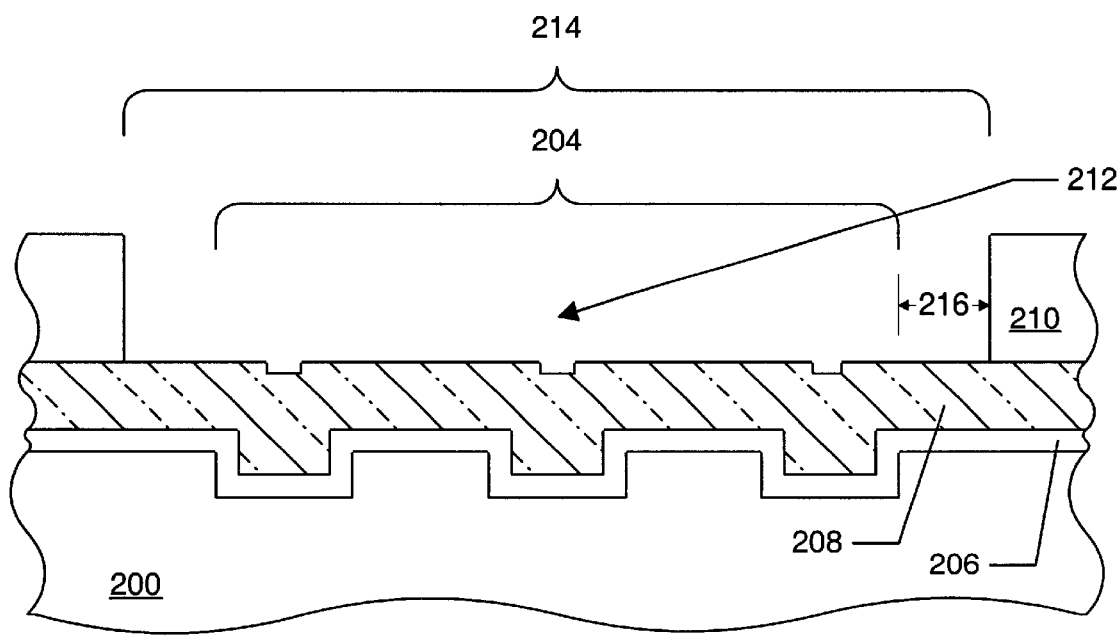
FIG. 8 is a partial cross-sectional view of the semiconductor topography, wherein a window is patterned in the masking layer that substantially defines a window area of the semiconductor substrate according to a processing step subsequent to FIG. 7.

As shown in FIG. 8, window 212 may then be patterned in masking layer 210. Patterning of window 212 may occur by appropriately exposing and developing a masking layer 210 made of resist. The boundaries of window 212 preferably substantially define window area 214 of semiconductor substrate 200. Alignment mark area 204 is preferably contained within window area 214. Any features within window area 214 that are usable for alignment are preferably contained within alignment mark area 204 and are absent from the portions of window area 214 outside of alignment mark area 204.

The boundaries of window area 214 are preferably spaced from the boundaries of alignment mark area 204 by at least first distance 216. The portion of window area 214 outside of alignment mark area 204 forms a buffer zone between the two areas. As stated above, formation of a buffer zone between the two areas preferably ensures that there is at least a small surface area of semiconductor substrate 200 immediately adjacent to alignment mark area 204 that is also protected from CMP-induced damage. The size of the first distance may be largely determined by the size of the buffer zone between alignment mark area 204 and window area 214 necessary for optimal alignment. First distance 216 may be minimally greater than zero, but is preferably at least 1 micron. The maximum length for first distance 216 may be as great as 2–3 millimeters.

Figure 9A:
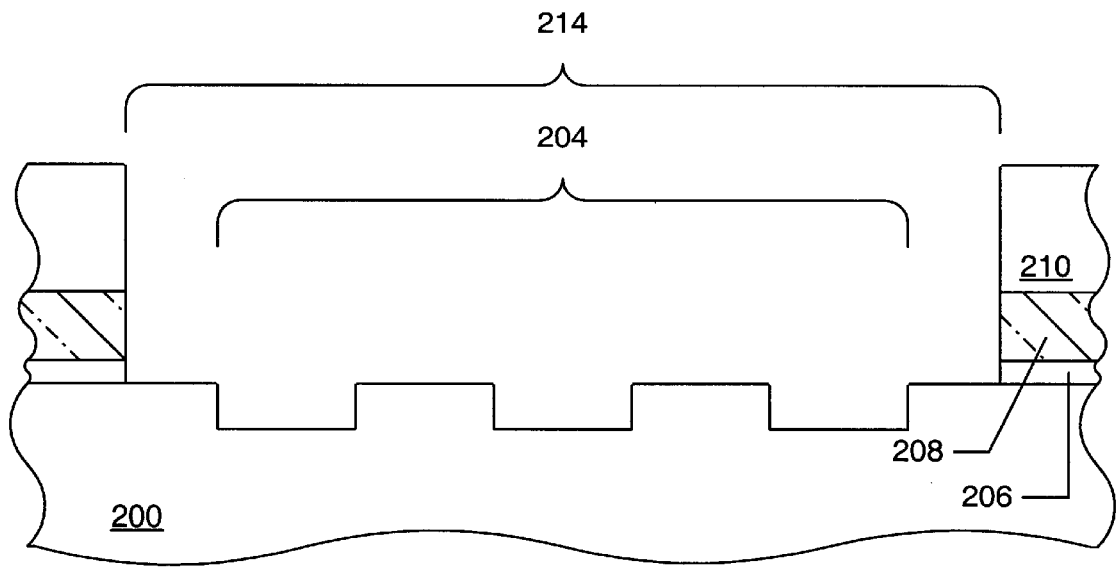
FIG. 9a is a partial cross-sectional view of the semiconductor topography, wherein portions of the nitride layer and the oxide layer within the window area are removed according to a processing step subsequent to FIG. 8.

FIG. 9a presents a processing step in which portions of at least one auxiliary layer disposed above semiconductor substrate 200 and beneath masking layer 210 are removed from above window area 214. In this example, the auxiliary layers are oxide layer 206 and nitride layer 208. Such removal preferably results in the upper surface of semiconductor substrate 200 within window area 214 becoming uncovered. Removal of oxide layer 206 and nitride layer 208 may be undertaken by exposing each layer to an etchant in an etch process suitably configured to remove each layer. Nitride layer 208 and oxide layer 206 may be removed, for example, in a dry etch process. Portions of the semiconductor topography that are beneath masking layer 210 are preferably prevented from being removed during this step.

As stated above, oxide layer 206 and nitride layer 208 are auxiliary layers formed as part of the overall fabrication process. A possible reason for forming these layers is so they can be used in the formation of an isolation trench in a field region of semiconductor substrate 200. Isolation trench formation often involves the formation of a pad oxide layer (oxide layer 206) upon which a nitride masking layer (nitride layer 208) is formed. Portions of the nitride masking layer and the pad oxide layer may then be removed to provide the pattern for the etching of the isolation trench.

Figure 9B:
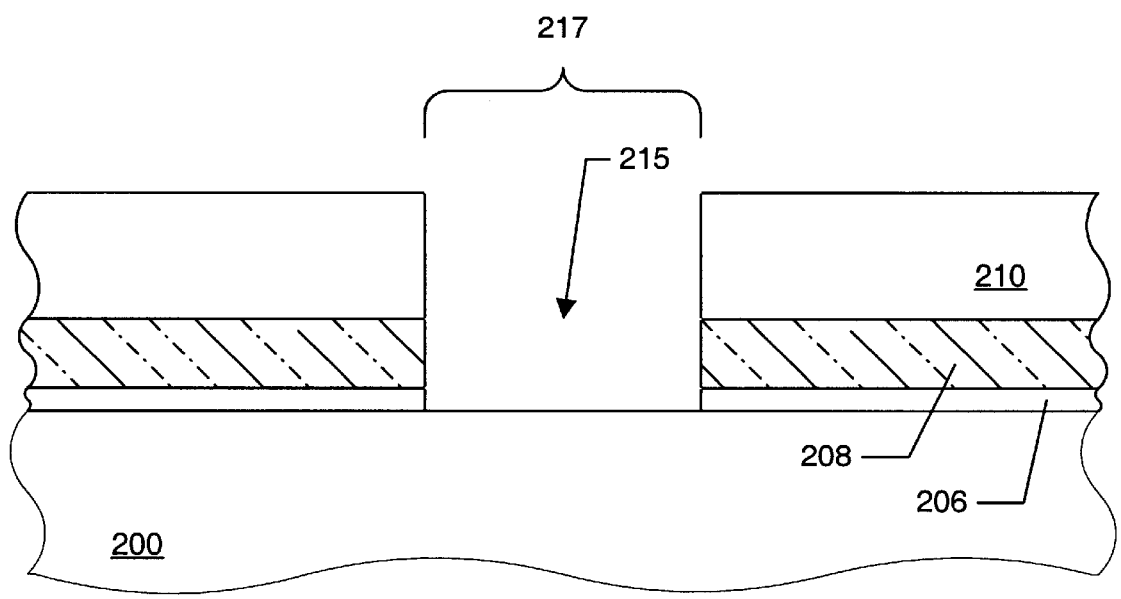
FIG. 9b is a partial cross-sectional view of the semiconductor topography, wherein an isolation trench window is formed that substantially defines an isolation trench area according to a processing step subsequent to FIG. 8.

FIG. 9b shows a processing step in which portions of nitride layer 208 and oxide layer 206 above isolation trench area 217 are removed. Before the processing step shown in FIG. 9b, an isolation trench window 215 may be formed in masking layer 210. Isolation trench window 215 may be formed at the same time as window 212 or in a separate processing step. The isolation trench window substantially defines isolation trench area 217. The portions of nitride layer 208 and oxide layer 206 above isolation trench area 217 of semiconductor substrate 200 may be removed concurrently with the portions of those layers above window area 214 or in a separate processing step.

Figure 10A:
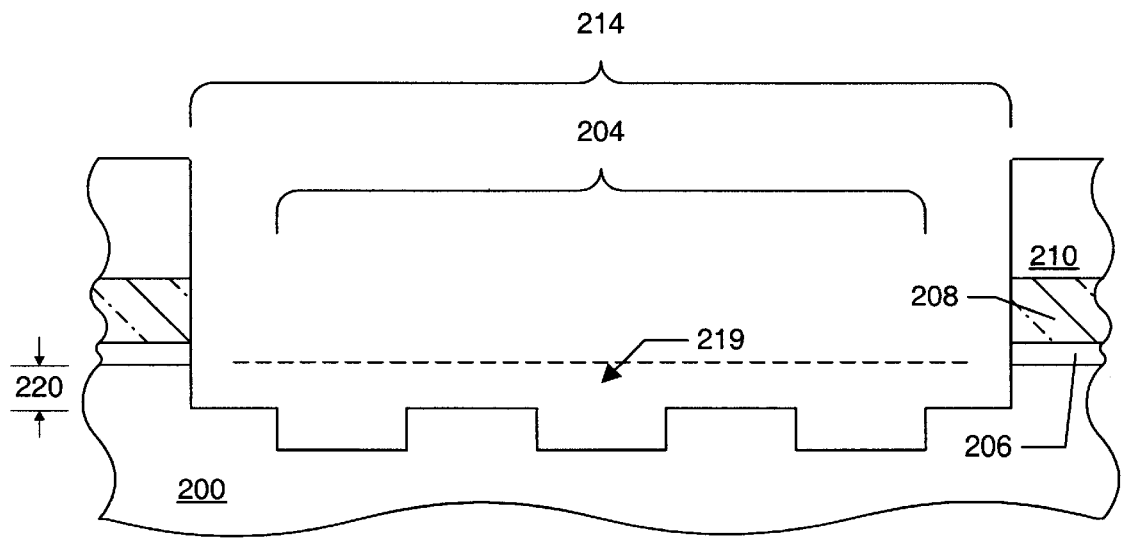

FIG. 10a depicts a processing step in which the upper surface of semiconductor substrate 200 within window area 214 is recessed below the upper surface of semiconductor substrate 200 outside of window area 214 such that alignment mark trench 219 is formed within the window area. Such recession is preferably accomplished by exposing the upper surface of the semiconductor substrate within window area 214 to an etchant. The etchant used preferably removes the silicon at substantially the same rate across window area 214.

Since the etchant preferably lowers the substrate upper surface by the same distance regardless of elevation, all features within window area 214, and particularly within alignment mark area 204, may be preserved. The upper surface of the semiconductor substrate within window area 214 is preferably recessed an alignment mark trench depth 220. This distance depends on the parameters of the etching process used to effect recession (e.g., choice of etchant, time of exposure, etc.). Alignment mark trench depth 220 should be sufficiently deep to prevent CMP-induced damage to the upper surface of the semiconductor substrate within window area 214 during further processing steps.

Recession of the upper surface of the semiconductor substrate within window area 214 may be carried out by the use of a dry or wet etch process. There are numerous etchants known in the art that are capable of etching silicon at a substantially even rate over a given area. Etchants appropriate for achieving the goals stated herein will be apparent to those skilled in the art having the benefit of this disclosure.

Figure 10B:
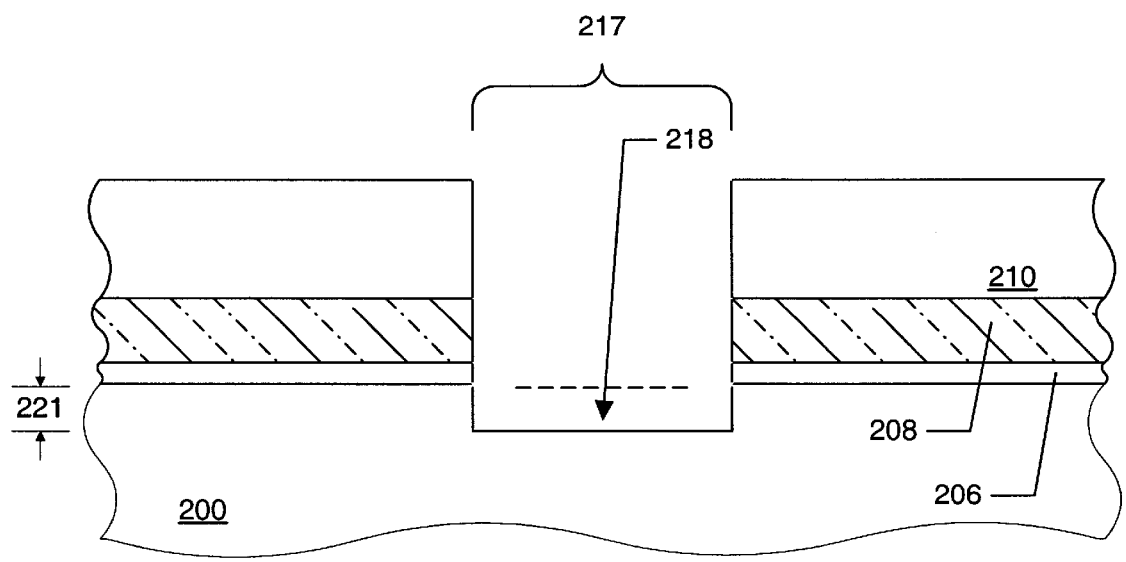
FIG. 10b is a partial cross-sectional view of the semiconductor topography, wherein an isolation trench is formed within the isolation trench area of the semiconductor substrate according to a processing step subsequent to FIG. 9b.

FIG. 10b depicts a processing step wherein isolation trench 218 is formed within isolation trench area 217. Isolation trench 218 may be formed to isolation trench depth 221 in an etch process similar to that in which alignment mark trench 219 is formed. If isolation trench 218 is a shallow isolation trench, then isolation trench depth 221 may be about 300–5000 angstroms.

Recessing the upper surface of the semiconductor substrate within window area 214 may be carried out concurrently with forming isolation trench 218 by simultaneously exposing the upper surface of semiconductor substrate 200 within window area 214 and within isolation trench area 217 to an etchant. Consequently, isolation trench depth 221 and alignment mark trench depth 220 may be substantially equal. Recessing the upper surface of semiconductor substrate 200 within window area 214 in such a manner is beneficial at least in part because an extra etch step beyond the isolation trench etch step is not needed.

Figure 11:
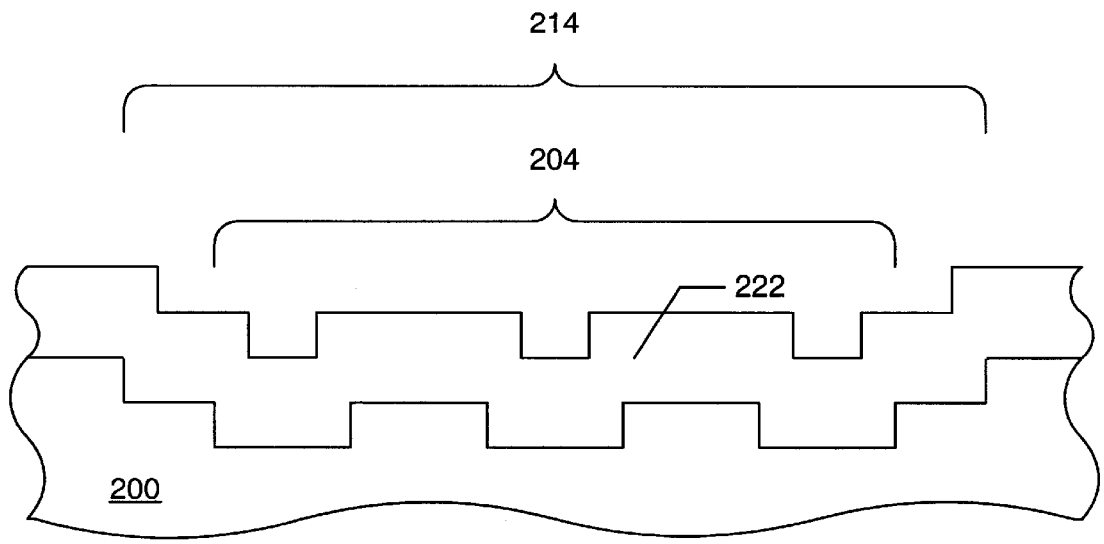

FIG. 11 depicts a processing step in which an alignment mark trench fill material 222 is deposited such that alignment mark trench 219 is substantially filled. Suitable materials for alignment mark trench fill material 222 include oxide, silicon oxynitride ("oxynitride"), or other isolation materials appropriate for semiconductor devices. Alignment mark trench fill material 222 may be deposited, for example, as fill for isolation trench 219.

Figure 12:
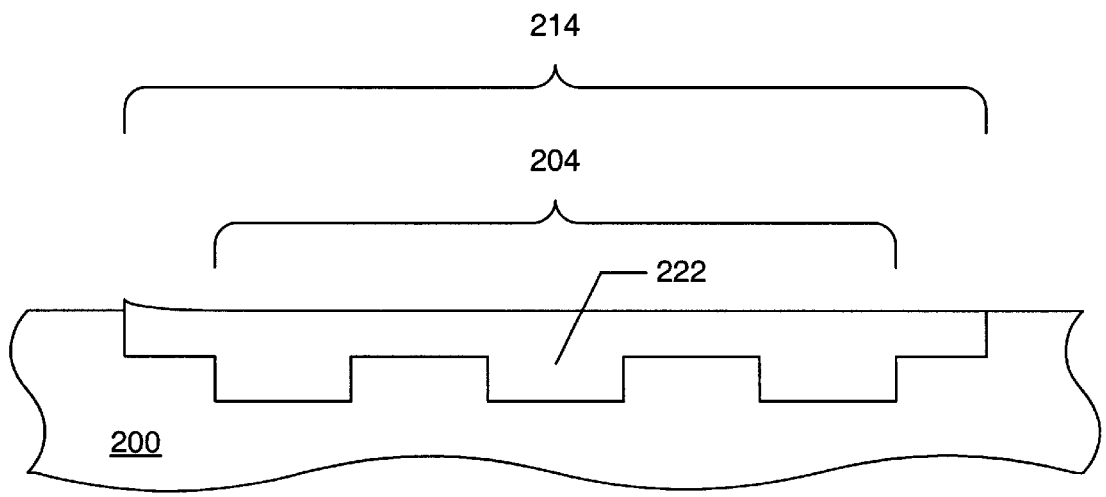
FIG. 12 is a partial cross-sectional view of the semiconductor topography, wherein the alignment mark trench fill material is planarized such that its upper surface is substantially coplanar with the upper surface of the semiconductor substrate outside of the window area according to a processing step subsequent to FIG. 11.

FIG. 12 presents a processing step in which alignment mark trench fill material 222 is polished by use of CMP. Such polishing preferably results in an upper surface of the alignment mark trench fill material being substantially coplanar with the upper surface of semiconductor substrate 200 outside of window area 214. The upper surface of alignment mark trench fill material 222 is preferably flat. As can be seen in FIG. 12, however, the upper surface of alignment mark trench fill material 222 may not be perfectly flat. But since the alignment system preferably works off radiation reflected off the substrate surface and not the alignment mark trench fill material surface, the condition of alignment mark trench fill material 222 preferably does not have a large effect on the outcome of the alignment process.

Figure 13:
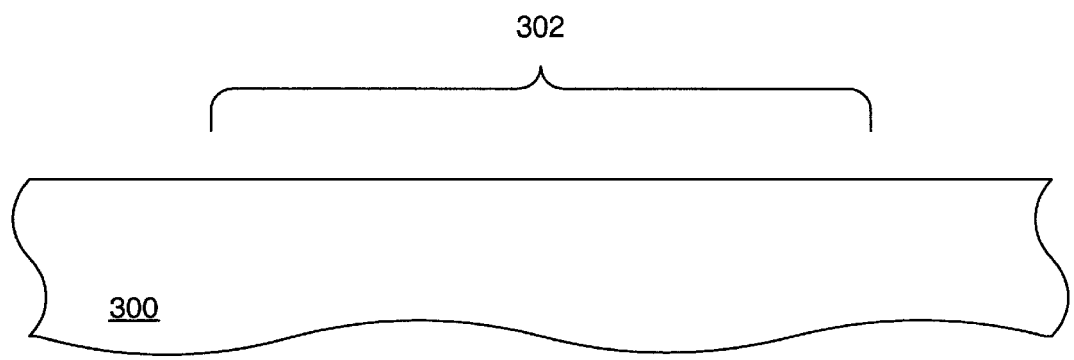
FIG. 13 is a partial cross-sectional view of a semiconductor topography in accordance with another embodiment of the present invention.

FIGS. 13–23 illustrate another embodiment for forming an alignment mark that is substantially recessed. FIG. 13 presents a partial cross-sectional view of semiconductor substrate 300. Semiconductor substrate 300 is preferably a lightly-doped wafer of single crystal silicon. In subsequent processing steps, features will be patterned in alignment mark area 302 of semiconductor substrate for forming an alignment mark. Alignment mark area 302 preferably has the same dimensions as previously described alignment mark area 204.

Figure 14:
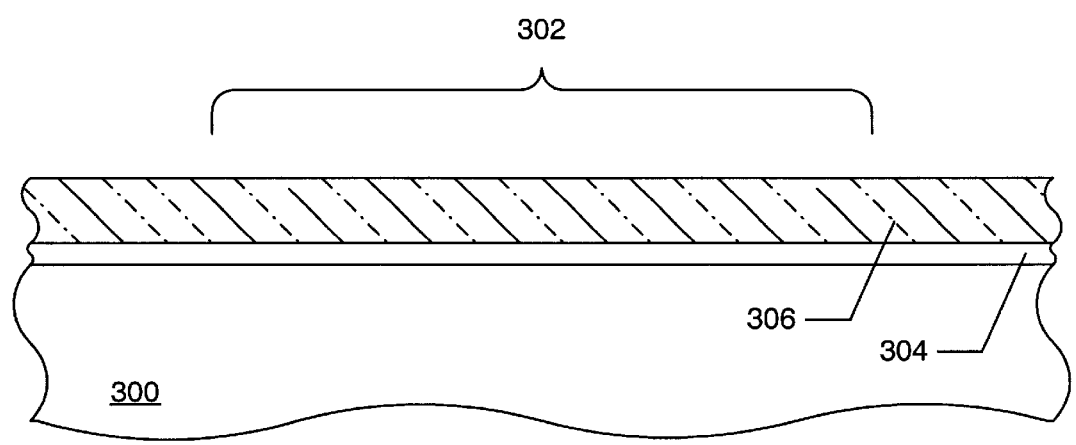
FIG. 14 is a partial cross-sectional view of the semiconductor topography, wherein an oxide layer and a nitride layer are formed according to a processing step subsequent to FIG. 13.

FIG. 14 presents a processing step in which oxide layer 304 and nitride layer 306 are formed above semiconductor substrate 300. These layers may be considered to be auxiliary layers in the sense of this disclosure; the layers may be formed as part of the overall manufacturing process but the particular compositions or number of the layers are not essential to the present method. Modifications may be made to the combination of layers deposited in this step as may be necessitated by the overall fabrication process and as would be apparent to one skilled in the art having the benefit of this disclosure.

Figure 15:
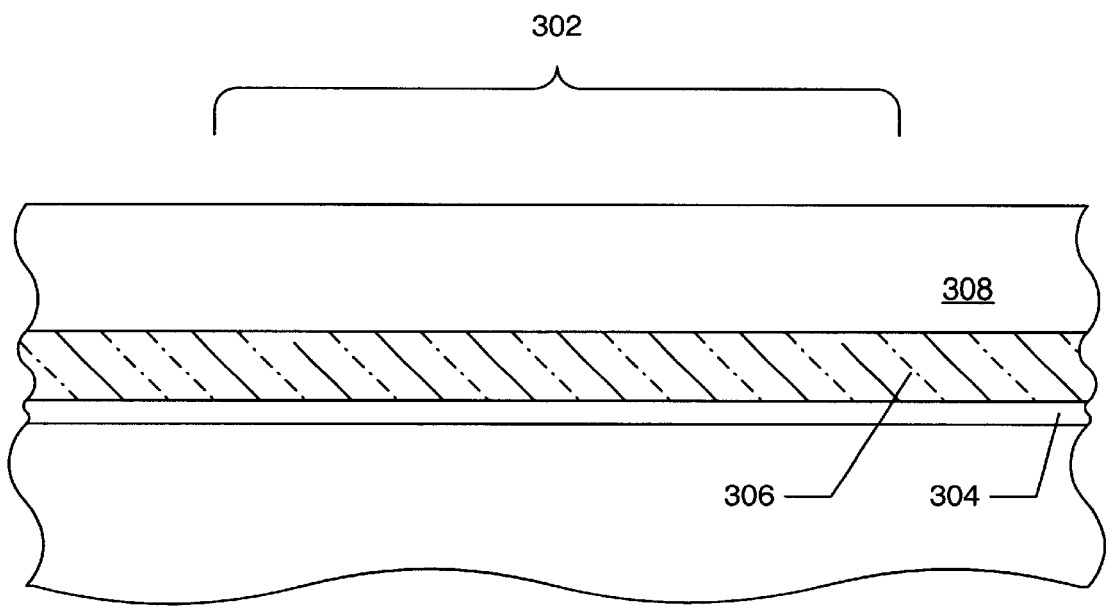
FIG. 15 is a partial cross-sectional view of the semiconductor topography, wherein a masking layer is formed according to a processing step subsequent to FIG. 14.

FIG. 15 presents a subsequent processing step in which masking layer 308 is formed above semiconductor substrate 300. Masking layer 308 is preferably composed of photoresist, and may be spun on as known in the art.

Figure 16:
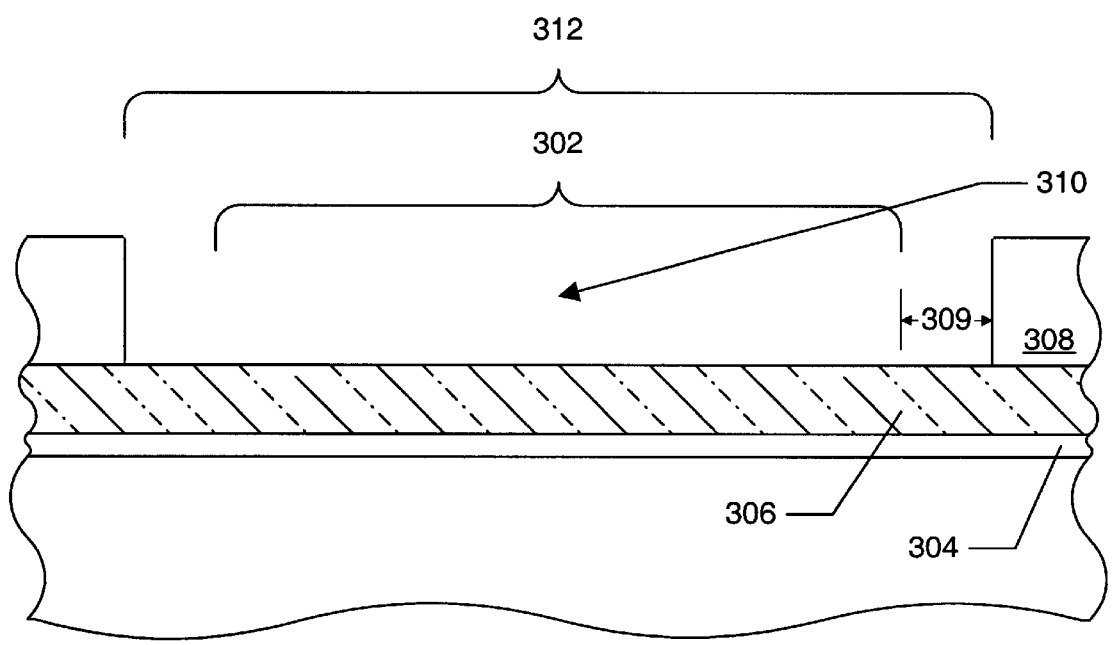
FIG. 16 is a partial cross-sectional view of the semiconductor topography, wherein a window is patterned in the masking layer that substantially defines a window area of the semiconductor substrate according to a processing step subsequent to FIG. 15.

As shown in FIG. 16, window 310 may then be patterned in masking layer 308. Patterning of window 310 may occur by appropriately exposing and developing a masking layer 308 made of resist. The boundaries of window 310 preferably substantially define window area 312 of semiconductor substrate 300. Alignment mark area 302 is preferably contained within window area 312. Any features formed in subsequent processing steps within window area 312 that are usable for alignment are preferably contained within alignment mark area 302 and are absent from the portions of window area 312 outside of alignment mark area 302.

The boundaries of window area 312 are preferably spaced from the boundaries of alignment mark area 302 by at least first distance 309. The portion of window area 312 outside of alignment mark area 302 forms a buffer zone between the two areas. As stated above, formation of a buffer zone between the two areas preferably ensures that there is at least a small surface area of semiconductor substrate 300 immediately adjacent to alignment mark area 302 that is also protected from CMP-induced damage. The size of the first distance may be largely determined by the size of the buffer zone between alignment mark area 302 and window area 312 necessary for optimal alignment. First distance 309 may be minimally greater than zero, but is preferably at least 1 micron. The maximum length for first distance 309 may be as great as 2–3 millimeters.

Figure 17A:
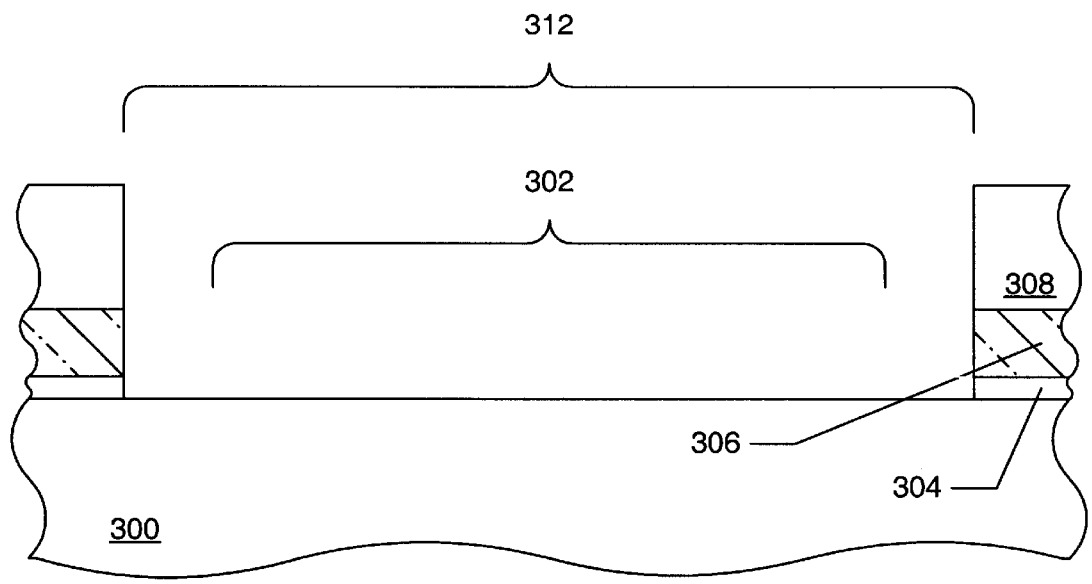
FIG. 17a is a partial cross-sectional view of the semiconductor topography, wherein portions of the nitride layer and the oxide layer within the window area are removed according to a processing step subsequent to FIG. 16.

FIG. 17a presents a processing step in which portions of at least one auxiliary layer disposed above semiconductor substrate 300 and beneath masking layer 308 are removed from above window area 312. In this example, the auxiliary layers are oxide layer 304 and nitride layer 306. Such removal preferably results in the upper surface of semiconductor substrate 300 within window area 312 becoming uncovered. Removal of oxide layer 304 and nitride layer 306 may be undertaken by exposing each layer to an etchant in an etch process suitably configured to remove each layer. Nitride layer 306 and oxide layer 304 may be removed, for example, in a dry etch process. Portions of the semiconductor, topography that are beneath masking layer 308 are preferably prevented from being removed during this step.

As stated above, oxide layer 304 and nitride layer 306 are auxiliary layers formed as part of the overall fabrication process. One possible reason for forming these layers is so they can be used in the formation of an isolation trench in a field region of semiconductor substrate 300. Isolation trench formation often involves the formation of a pad oxide layer (oxide layer 304) upon which a nitride masking layer (nitride layer 306) is formed. Portions of the nitride masking layer and the pad oxide layer may then be removed to provide the pattern for the etching of the isolation trench.

Figure 17B:
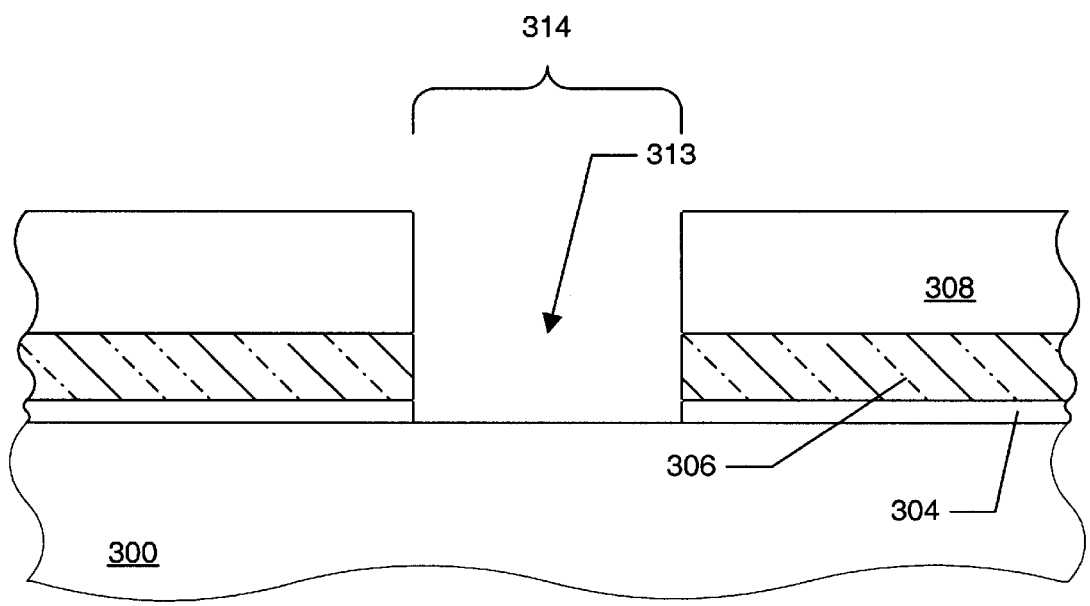
FIG. 17b is a partial cross-sectional view of the semiconductor topography, wherein an isolation trench window is formed that substantially defines an isolation trench area of the semiconductor substrate according to a processing step subsequent to FIG. 16.

FIG. 17b shows a processing step in which portions of nitride layer 306 and oxide layer 304 above isolation trench area 314 are removed. Before the processing step shown in FIG. 9b, an isolation trench window 313 may be formed in masking layer 308. Isolation trench window 313 may be formed at the same time as window 310 or in a separate processing step. The isolation trench window substantially defines isolation trench area 314. The portions of nitride layer 306 and oxide layer 304 above isolation trench area 314 of semiconductor substrate 300 may be removed concurrently with the portions of those layers above window area 312 or in a separate processing step.

Figure 18A:
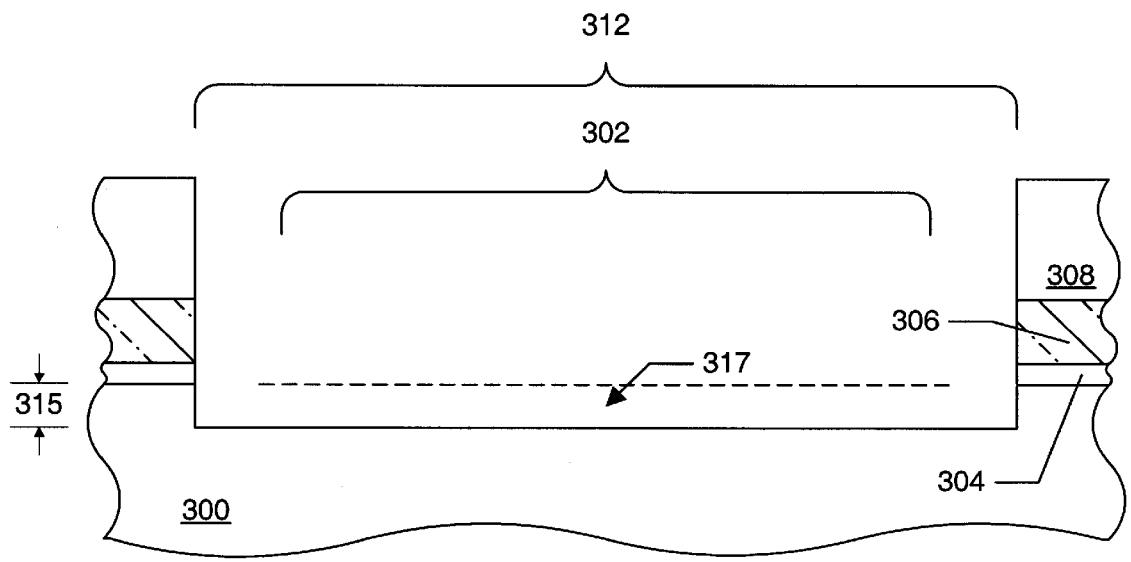

FIG. 18a depicts a processing step in which the upper surface of semiconductor substrate 300 within window area 312 is recessed below the upper surface of semiconductor substrate 200 outside of window area 312 such that alignment mark trench 317 is formed within the window area. Such recession is preferably accomplished by exposing the upper surface of the semiconductor substrate within window area 312 to an etchant. The etchant used preferably removes the silicon at substantially the same rate across window area 312.

The etchant preferably lowers the substrate upper surface by the same distance regardless of elevation. Thus, all elevational disparities in the upper surface of semiconductor substrate 300 within window area 312, if any are present, may be preserved. The upper surface of the semiconductor substrate within window area 312 is preferably recessed an alignment mark trench depth 315 into the semiconductor substrate. This distance depends on the parameters of the etching process used to effect recession (e.g., choice of etchant, time of exposure, etc.). Alignment mark trench depth 315 should be sufficiently deep to prevent CMP-induced damage to the upper surface of the semiconductor substrate within window area 312 during further processing steps.

Recession of the upper surface of the semiconductor substrate within window area 312 may be carried out by the use of a dry or wet etch process. There are numerous etchants known in the art that are capable of etching silicon at a substantially even rate over a given area. Etchants appropriate for achieving the goals stated herein will be apparent to those skilled in the art having the benefit of this disclosure.

Figure 18B:
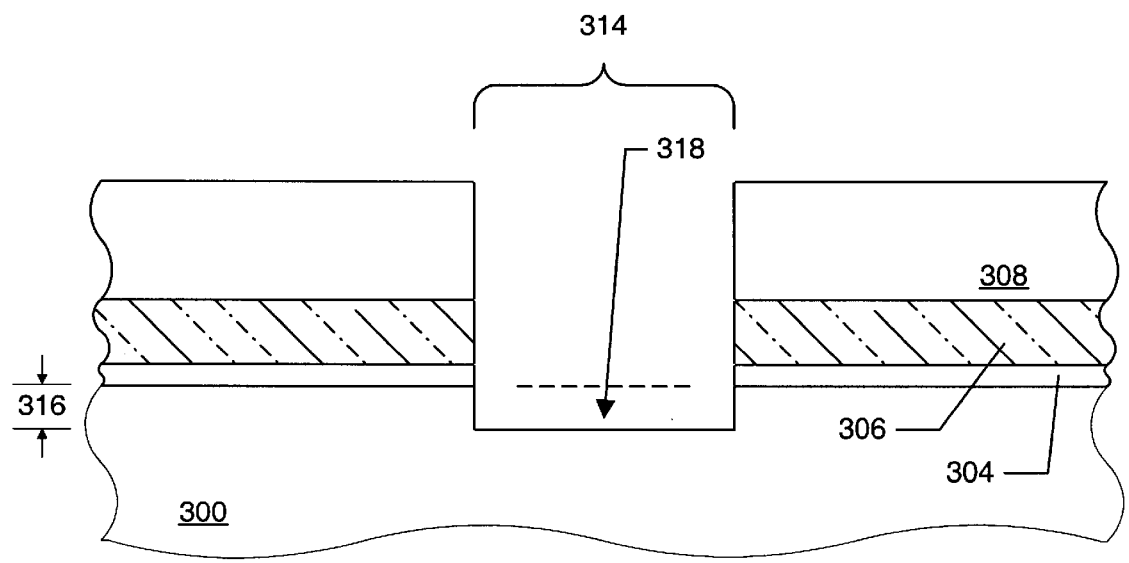
FIG. 18b is a partial cross-sectional view of the semiconductor topography, wherein an isolation trench is formed within the isolation trench area of the semiconductor substrate according to a processing step subsequent to FIG. 17b.

FIG. 18b depicts a processing step wherein isolation trench 318 is formed within isolation trench area 314. Isolation trench 318 may be formed to isolation trench depth 316 in an etch process similar to that in which alignment mark trench 317 is formed. If isolation trench 318 is a shallow isolation trench, then isolation trench depth 221 may be about 300–5000 angstroms.

Recessing the upper surface of the semiconductor substrate within window area 312 may be carried out concurrently with forming isolation trench 318 by simultaneously exposing the upper surface of semiconductor substrate 300 within window area 312 and within isolation trench area 314 to an etchant. Consequently, isolation trench depth 316 and alignment mark trench depth 315 may be substantially equal. Recessing the upper surface of semiconductor substrate 300 within window area 312 in such a manner is beneficial at least in part because an extra etch step beyond the isolation trench etch step is not needed to form alignment mark trench 317.

Figure 19:
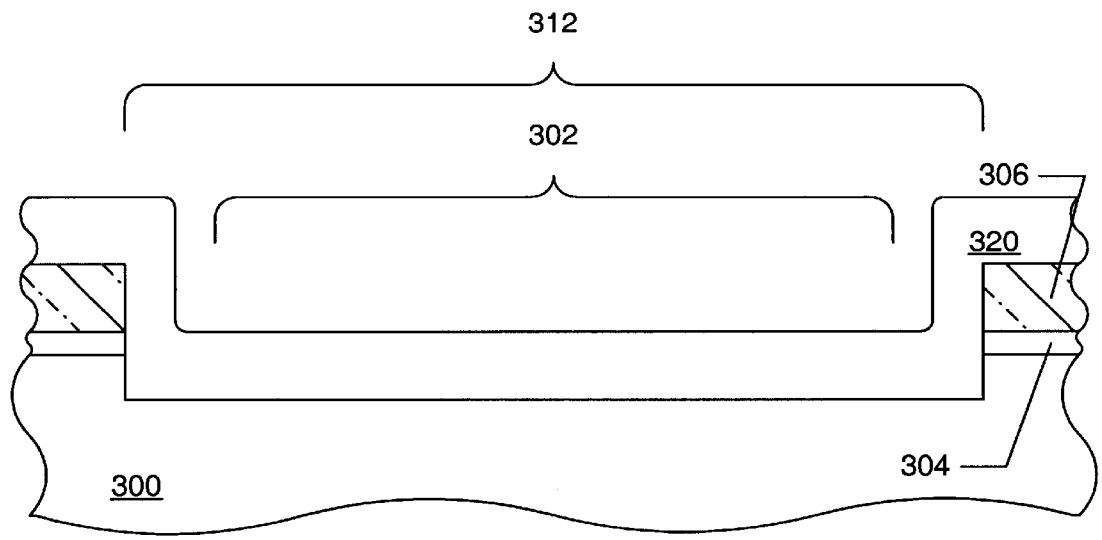

FIG. 19 depicts a processing step in which masking layer 320 is formed above semiconductor substrate 300. Masking layer 308 is preferably composed of photoresist, and may be spun on as known in the art. Consequently, masking layer 320 preferably conforms to the underlying topography.

Figure 20:
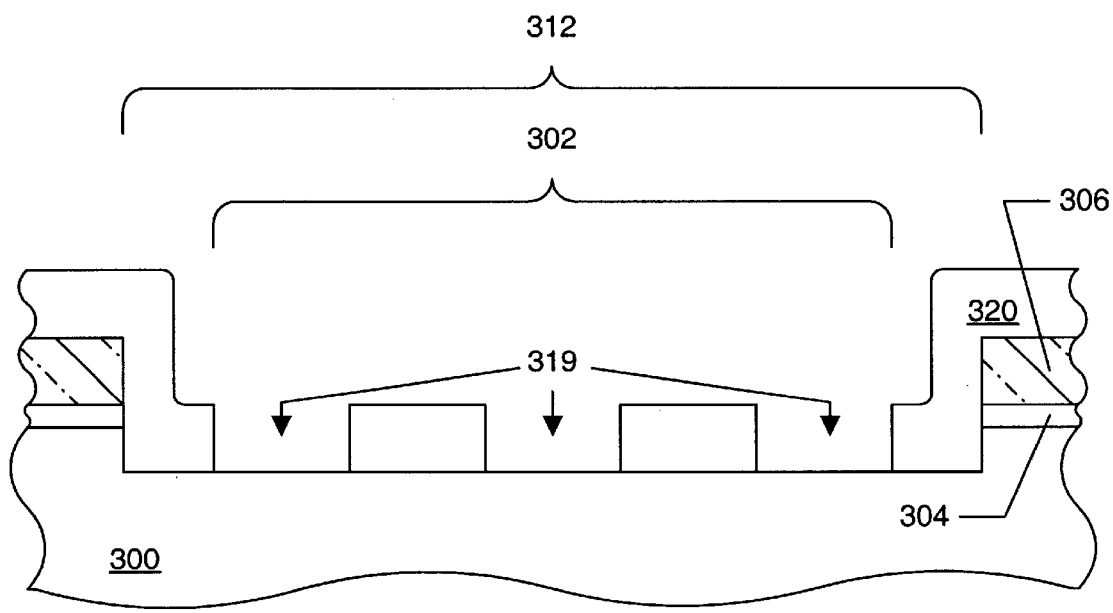
FIG. 20 is a partial cross-sectional view of the semiconductor topography, wherein groove windows are patterned in the second masking layer according to a processing step subsequent to FIG. 19.

FIG. 20 presents a subsequent processing step in which groove windows 319 are patterned in masking layer 320. Groove windows 319 may be formed by selectively exposing and developing masking layer 320. Groove windows 319 are preferably formed entirely within alignment mark area 302.

Figure 21:
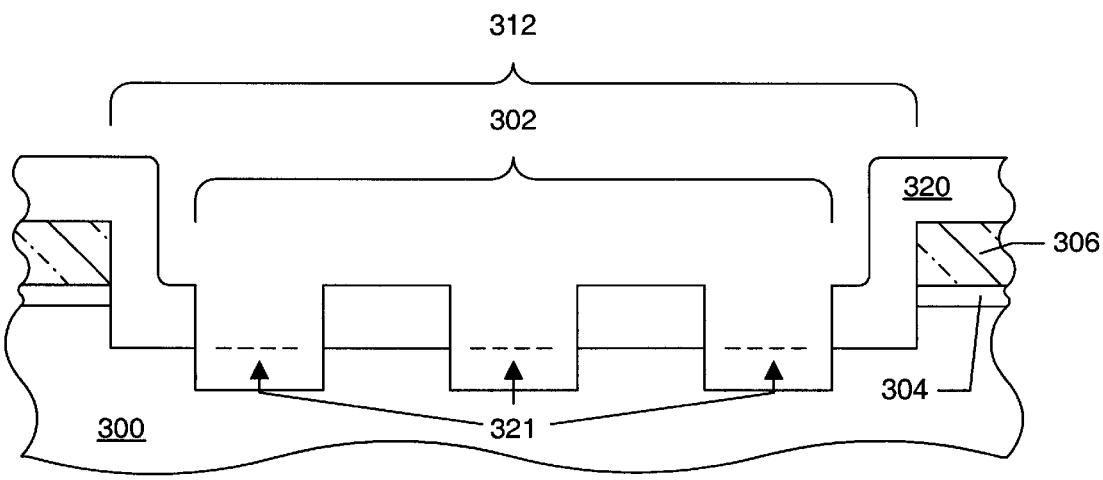
FIG. 21 is a partial cross-sectional view of the semiconductor topography, wherein grooves are patterned in the alignment mark area of the semiconductor substrate according to a processing step subsequent to FIG. 20.

FIG. 21 shows a subsequent processing step in which an alignment mark is formed in alignment mark area 302 of semiconductor substrate 300. Although the alignment mark may be any of the wide variety known in the art, the alignment mark shown in FIG. 21 preferably contains a series of grooves 321 arranged within alignment mark area 302.

Grooves 321 may be patterned into the semiconductor substrate by exposing the portions of the semiconductor substrate under groove windows 319 and not protected by masking layer 320 to an etchant for a time suitable to form the grooves. The etchant used may be similar to that used to recess the upper surface of semiconductor substrate 300 within window area 312, as described above. Alignment mark area 302 may contain more grooves than are shown in FIG. 21. Additionally, grooves 321 are not necessarily positioned in the particular spatial relationship shown, but may instead be arranged in any number of alternate configurations. Grooves 321 may function similarly to grooves 202.

Figure 22:
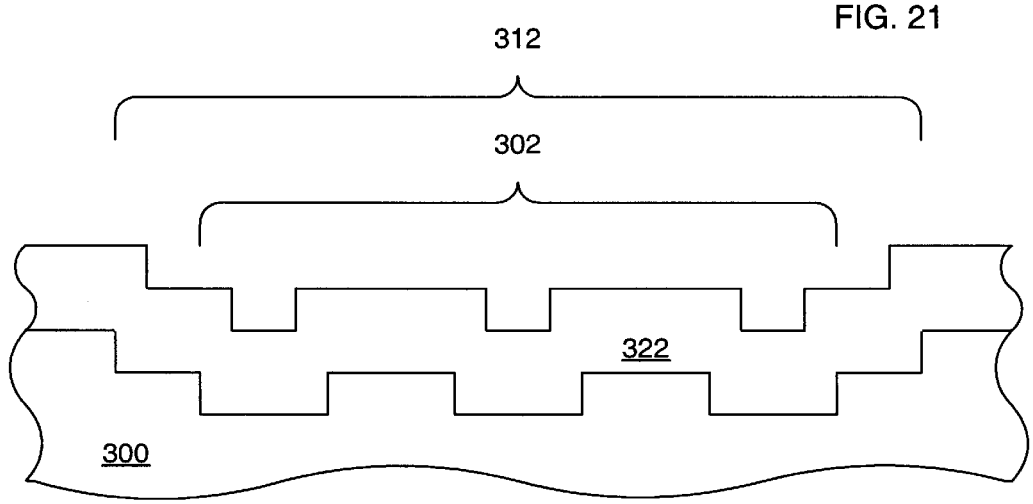
FIG. 22 is a partial cross-sectional view of the semiconductor topography, wherein an alignment mark trench fill material is deposited according to a processing step subsequent to FIG. 21.

FIG. 22 depicts a processing step in which an alignment mark trench fill material 322 is deposited such that alignment mark trench 317 is substantially filled. Suitable materials for alignment mark trench fill material 322 include oxide, oxynitride, or other isolation materials appropriate for use in semiconductor devices. Alignment mark trench fill material 322 may be deposited, for example, as fill for isolation trench 317.

Figure 23:
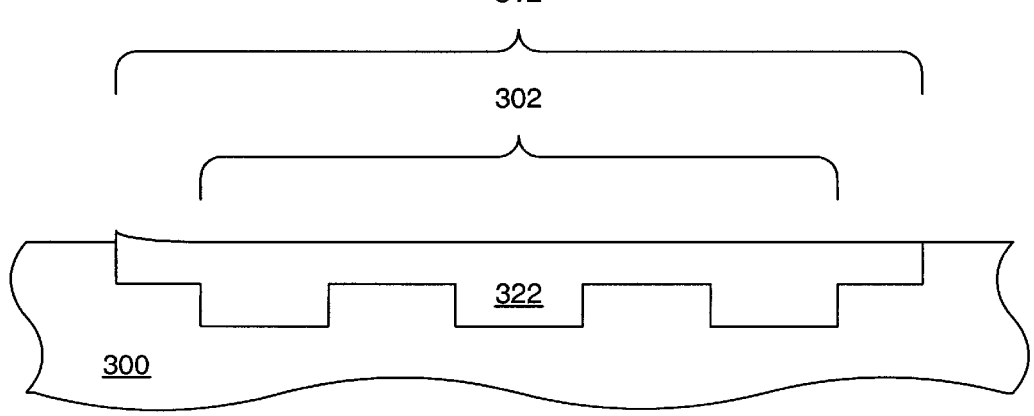
FIG. 23 is a partial cross-sectional view of the semiconductor topography, wherein the alignment mark trench fill material is planarized such that its upper surface is substantially coplanar with the upper surface of the semiconductor substrate outside of the window area according to a processing step subsequent to FIG. 22.

FIG. 23 presents a processing step in which alignment mark trench fill material 322 is polished by use of CMP. Such polishing preferably results in an upper surface of the alignment mark trench fill material being substantially coplanar with the upper surface of semiconductor substrate 300 outside of window area 312. The upper surface of alignment mark trench fill material 322 is preferably flat. As can be seen in FIG. 23, however, the upper surface of alignment mark trench fill material 322 may not be perfectly flat. But since the alignment system preferably works off radiation reflected off the substrate surface and not the alignment mark trench fill material surface, the condition of alignment mark trench fill material 322 preferably does not have a large effect on the outcome of the alignment process.

In the aforementioned embodiment, the forming of an alignment mark in alignment mark area 302 is preferably undertaken prior to recessing the upper surface of the semiconductor substrate within window area 312 of semiconductor substrate 300. Because the alignment mark is formed in a relatively late step of the process, it is preferred that another alignment mark be previously formed in a different alignment mark area of semiconductor substrate. Such a previously-formed alignment mark would give an exposure tool a pattern to align to for the exposure of window 310 and other patterns. The previously-formed alignment mark may be fabricated in a conventional process. Alternately, the method described above in relation to semiconductor substrate 200 may be performed in an alignment mark area of semiconductor 300 concurrently with the method described above in relation to semiconductor substrate 300. For example, the alignment mark formed in the step described in relation to FIG. 5 may be used for alignment in subsequent steps. Other combinations will be apparent to those skilled in the art having the benefit of this disclosure.

It will be appreciated by those skilled in the art having the benefit of this disclosure that both the semiconductor topography and the method for processing a semiconductor substrate provided herein are suitable for use with numerous applications relating to protection of an alignment mark formed in a semiconductor substrate. Further modifications and alternative embodiments of various aspects of the invention will be apparent to those skilled in the art in view of this description. For example, more than one alignment mark may be formed in the semiconductor substrate in the manner described herein. It is intended that the following claims be interpreted to embrace all such modifications and changes and, accordingly, the specification and drawings are to be regarded in an illustrative rather than a restrictive sense.

What is claimed is:

1. A method for processing a semiconductor substrate, comprising:

forming an alignment mark in an alignment mark area of the semiconductor substrate, the alignment mark area being contained within and part of a window area of the semiconductor substrate; and recessing an entirety of an upper surface of the semiconductor substrate within the window area to a level below an upper surface of the semiconductor substrate outside the window area such that the alignment mark made is recessed within an alignment mark trench.

2. The method of claim 1, wherein said forming an alignment mark in an alignment mark area is carried out prior to said recessing an entirety of an upper surface of the semiconductor substrate within the window area.

3. The method of claim 1, wherein said forming an alignment mark in an alignment mark area is carried out subsequent to said recessing an entirety of an upper surface of the semiconductor substrate within the window area.

4. The method of claim 1, wherein said recessing an entirety of an entirety of an upper surface of the semiconductor substrate within the window area comprises exposing an upper surface of the semiconductor substrate within the window area to an etchant.

5. The method of claim 1, wherein boundaries of the alignment mark area are spaced at least a first distance from boundaries of the window area.

6. The method of claim 1, wherein said forming an alignment mark comprises patterning a groove in the semiconductor substrate within the alignment mark area.

7. The method of claim 1, further comprising prior to said recessing an entirety of an upper surface of the semiconductor substrate within the window area:

forming a masking layer above the semiconductor substrate; and patterning a window in the masking layer, wherein boundaries of the window substantially define the window area.

8. The method of claim 1, further comprising, concurrent with said recessing an entirety of an upper surface of the semiconductor substrate within the window area, forming an isolation trench in the semiconductor substrate.

9. The method of claim 8, wherein the alignment mark trench comprises an alignment mark trench depth, and wherein the isolation trench comprises an isolation trench depth, and wherein the alignment mark trench depth and the isolation trench depth are substantially equal.

10. A method for processing a semiconductor substrate, comprising:

patterning a groove within an alignment mark area of the semiconductor substrate for forming an alignment mark;

forming a masking layer above the semiconductor substrate;

patterning a window in the masking layer, wherein boundaries of the window substantially define a window area of the semiconductor substrate, and wherein the alignment mark area is contained within and part of the window area; and exposing an entirety of an upper surface of the semiconductor substrate within the window area to an etchant for recessing the upper surface of the semiconductor substrate within the window area below an upper surface of the semiconductor substrate outside the window area such that an alignment mark trench is formed within the window area.

11. The method of claim 10, wherein said patterning a groove within an alignment mark area of the semiconductor substrate is carried out prior to said exposing an entirety of an upper surface of the semiconductor substrate within the window area to an etchant.

12. The method of claim 10, wherein said patterning a groove within an alignment mark area of the semiconductor substrate is carried out subsequent to said exposing an entirety of an upper surface of the semiconductor substrate within the window area to an etchant.

13. The method of claim 10, wherein boundaries of the alignment mark area are spaced at least a first distance from boundaries of the window area.

14. The method of claim 13, wherein the first distance is between about 1 micron and 3 millimeters.

15. The method of claim 10, wherein an auxiliary layer is disposed between the masking layer and the semiconductor substrate, and further comprising removing a portion of the auxiliary layer above the window area of the semiconductor substrate such that the upper surface of the semiconductor substrate within the window area is uncovered prior to said recessing the window area.

16. The method of claim 10, wherein an isolation trench window is defined in the masking layer and above the semiconductor substrate, and wherein boundaries of the isolation trench window define an isolation trench area of the semiconductor substrate, and wherein said exposing an entirety of an upper surface of the semiconductor substrate within the window area to an etchant comprises exposing an upper surface of the semiconductor area within the isolation trench area to the etchant.

17. The method of claim 10, further comprising aligning an exposure tool to the alignment mark.

18. The method of claim 10, further comprising:

depositing an alignment mark trench fill material into the alignment mark trench; and polishing the alignment mark trench fill material such that an upper surface of the alignment mark trench fill material is substantially coplanar with the upper surface of the semiconductor substrate.

19. A semiconductor topography, comprising:

a semiconductor substrate;

a window area of said semiconductor substrate, wherein an entirety of an upper surface of said semiconductor substrate within said window area is disposed an alignment mark trench depth below an upper surface of said semiconductor substrate outside of said window area such that an alignment mark trench is defined within said window area;

an alignment mark area of said semiconductor substrate that is contained within and part of said window area; and an alignment mark arranged within said alignment mark area.

20. The semiconductor topography of claim 19, wherein said alignment mark comprises a groove disposed in said semiconductor substrate.

21. The semiconductor topography of claim 19, wherein boundaries of said alignment mark area are spaced at least a first distance from boundaries of said window area.

22. The semiconductor topography of claim 21, wherein said first distance is between about 1 micron and 3 millimeters.

23. The semiconductor topography of claim 19, wherein an isolation trench is disposed within said semiconductor substrate, and wherein said isolation trench comprises an isolation trench depth, and wherein said alignment mark trench depth and said isolation trench depth are substantially equal.

* * * * *